(12) United States Patent
Abel et al.

(10) Patent No.: US 7,236,037 B2
(45) Date of Patent: Jun. 26, 2007

(54) ALTERNATING CLOCK SIGNAL GENERATION FOR DELAY LOOPS

(75) Inventors: Christopher J. Abel, Coplay, PA (US); Vladimir Sindalovsky, Perkasie, PA (US); Craig B. Ziemer, Fleetwood, PA (US)

(73) Assignee: Agere Systems Inc., Allentown, PA (US)

( * ) Notice: Subject to any disclaimer, the term of this patent is extended or adjusted under 35 U.S.C. 154(b) by 113 days.

(21) Appl. No.: 11/138,777

(22) Filed: May 26, 2005

(65) Prior Publication Data

US 2006/0267660 A1 Nov. 30, 2006

(51) Int. Cl.
*H03K 3/00* (2006.01)
(52) U.S. Cl. ...................... 327/291; 327/298
(58) Field of Classification Search ............... None
See application file for complete search history.

(56) References Cited

U.S. PATENT DOCUMENTS

| | | | | |
|---|---|---|---|---|
| 5,559,473 A | * | 9/1996 | Anderson et al. ............. 331/34 |
| 5,600,284 A | * | 2/1997 | Nguyen et al. ......... 331/177 R |
| 6,016,332 A | * | 1/2000 | Smith et al. ................. 375/376 |
| 6,462,623 B1 | * | 10/2002 | Horan et al. ................... 331/17 |
| 6,664,831 B2 | * | 12/2003 | Gauthier et al. ............. 327/159 |
| 6,727,737 B2 | * | 4/2004 | Trivedi et al. ............... 327/158 |
| 6,765,975 B2 | * | 7/2004 | Dunning et al. ............. 375/371 |
| 7,019,570 B2 | * | 3/2006 | Starr ........................... 327/156 |

FOREIGN PATENT DOCUMENTS

WO WO 97/14214 4/1997

\* cited by examiner

*Primary Examiner*—Timothy P. Callahan
*Assistant Examiner*—An T. Luu (57) ABSTRACT

A delay loop (e.g., a voltage-controlled delay loop) has (at least) two devices (e.g., interpolators) for generating clock signals for injection into the delay elements of the delay loop in a leap-frog manner, in which, while one interpolator is generating the clock signal currently selected for injection, the other interpolator can be controlled to generate the next clock signal to be selected for injection. This leap-frog technique can provide more settling time for generating injected clock signals than implementations that rely on a single interpolator.

8 Claims, 6 Drawing Sheets

ALTERNATING CLOCK SIGNAL GENERATION FOR DELAY LOOPS

CROSS-REFERENCE TO RELATED APPLICATIONS

The subject matter of this application is related to U.S. patent application Ser. No. 10/999,889, filed on Nov. 30, 2004 as the teachings of which are incorporated herein by reference.

The subject matter of this application is also related to U.S. patent application Ser. No. 11/138,703, filed on the same date as the teachings of which are incorporated herein by reference.

BACKGROUND OF THE INVENTION

1. Field of the Invention

The present invention relates to signal processing, and, in particular, to controlling phase in a delay loop, such as a voltage-controlled delay loop (VCDL) used to generate multiple sampling clock signals for sampling received data.

2. Description of the Related Art

Certain receivers that perform clock-and-data recovery (CDR) processing on their received signals employ a voltage-controlled delay loop having a plurality of sequentially arranged delay elements that generate multiple sampling clock signals used to sample data in the received signal. In order for such a receiver to operate properly, (1) the phases of the sampling clock signals should be phase-aligned with the data in the received signal and (2) the overall (i.e., bulk) delay of the VCDL should be the same as the period of the local reference clock signal used by the VCDL to generate the sampling clock signals. To achieve those goals, such receivers are typically designed with control loops that adjust the operations of the VCDL to ensure proper receiver operations. Failure to adequately control the VCDLs in such receivers can result in jitter in the sampling clock signals, which can adversely affect the results of the CDR processing.

SUMMARY OF THE INVENTION

Problems in the prior art are addressed in accordance with the principles of the present invention by implementing a receiver with a voltage-controlled delay loop having two interpolators for generating clock signals for injection into the delay elements of the VCDL in a leap-frog manner, in which, while one interpolator is generating the clock signal currently selected for injection, the other interpolator can be controlled to generate the next clock signal to be selected for injection. This leap-frog technique can provide more settling time for generating injected clock signals than implementations that rely on a single interpolator.

In one embodiment, the present invention is a circuitry comprising a delay loop having (i) a first (e.g., adjustable phase shift) device adapted to generate a first clock signal based on an input clock signal; (ii) a second (e.g., adjustable phase shift) device adapted to generate a second clock signal based on the input clock signal; and (iii) a plurality of sequentially arranged delay elements, each delay element connected to receive the first and second clock signals and adapted to generate a corresponding output clock signal. The delay loop is adapted to control (1) the generation of the first and second clock signals by the first and second devices and (2) selection of one of the first and second clock signals for injection into one of the delay elements, such that, when a currently selected clock signal is generated by an on-line one of the first and second devices, the other device is off-line. The delay loop is adapted to use the off-line device to generate a next clock signal to be injected into one of the delay elements.

In another embodiment, the present invention is a method for operating a delay loop comprising a plurality of sequentially arranged delay elements, each adapted to generate a corresponding output clock signal. The method comprises (i) generating a first clock signal based on an input clock signal; generating a second clock signal based on the input clock signal; and controlling (1) the generation of the first and second clock signals and (2) selection of one of the first and second clock signals for injection into one of the delay elements, such that, when the first clock signal is selected for injection into one of the delay elements, the second clock signal is generated off-line for subsequent injection into one of the delay elements.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
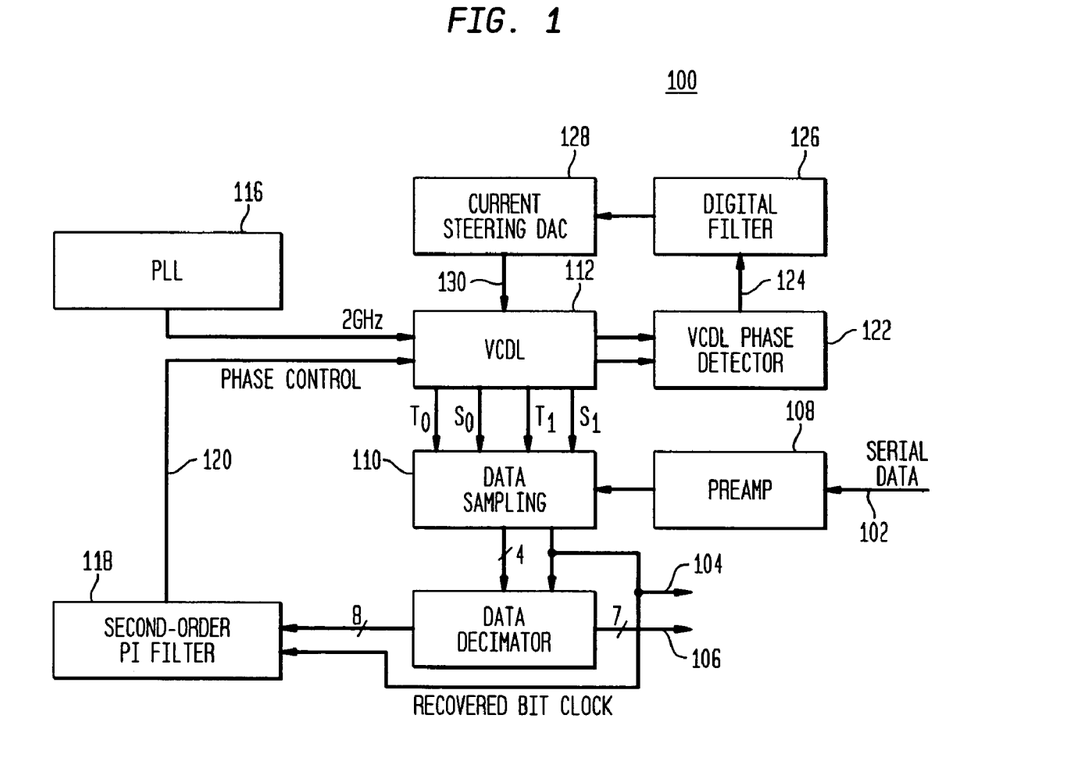
FIG. 1 shows a block diagram of a receiver that performs clock and data recovery (CDR) processing on a received serial data signal to recover a clock signal and a (parallel) data stream.

FIG. 1 shows a block diagram of receiver 100, which performs clock and data recovery (CDR) processing on a received serial data signal 102 to recover a clock signal 104 and a (parallel) data stream 106. In particular, serial data signal 102 is (optionally) pre-amplified (108) and sampled (110) to generate the data outputs. In this particular implementation, data sampler 110 over-samples the serial data signal by a factor of two (i.e., two samples per data bit in signal 102) using four sampling clock signals ($T_0, S_0, T_1, S_1$) generated by voltage-controlled delay loop (VCDL) 112 based on a PLL clock signal 114 received from phase-locked loop (PLL) 116. The four sampling clock signals are used by data sampler 110 to over-sample two consecutive data bits in data signal 102 by a factor of two. Further information about receiver 100 can be found in U.S. patent application Ser. No. 10/999,889, filed on Nov. 30, 2004 as, the teachings of which are incorporated herein by reference. Further information about VCDLs (also referred to as delay locked loops (DLLs)) can be found in PCT Patent Application No. WO 97/14214, published on Apr. 17, 1997, the teachings of which are also incorporated herein by reference. Note that, in other implementations of the present invention, clock signal 114 may be generated by a suitable high-speed clock source other than a PLL.

Figure 2:
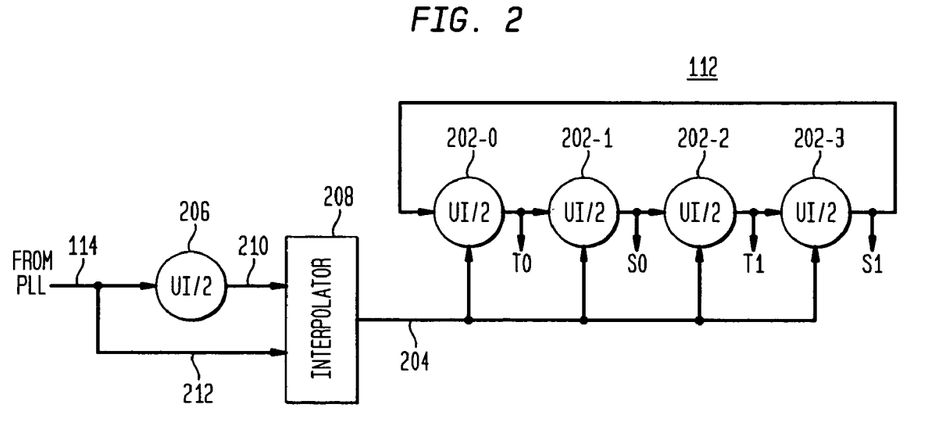
FIG. 2 shows a block diagram of the voltage-controlled delay loop (VCDL) of FIG. 1.

FIG. 2 shows a block diagram of voltage-controlled delay loop 112 of FIG. 1. VCDL 112 has a sequential arrangement of four delay elements 202-0, 202-1, 202-2, and 202-3, where:

- the output of delay element 202-0 is sampling clock signal $T_0$, which is also applied to delay element 202-1;
- the output of delay element 202-1 is sampling clock signal $S_0$, which is also applied to delay element 202-2;
- the output of delay element 202-2 is sampling clock signal $T_1$, which is also applied to delay element 202-3; and
- the output of delay element 202-3 is sampling clock signal $S_1$, which is also applied to delay element 202-0.

Figure 3:
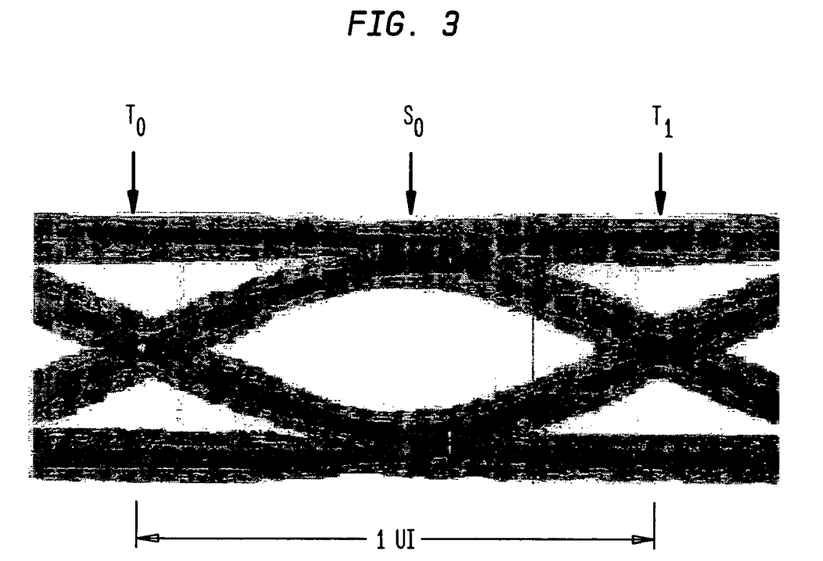
FIG. 3 shows a data-eye diagram representing ideal over-sampling of the data signal of FIG. 1 by a factor of two.

As indicated in FIG. 2, each delay element 202 delays the applied clock signal by one-half of a unit interval (UI), where one UI corresponds to the duration of a data bit in data signal 102 (see also FIG. 3).

FIG. 3 shows a data-eye diagram representing ideal over-sampling of data signal 102 by a factor of two, in which the data signal is sampled twice for each data bit in the data signal: once at the center of each bit and once at the transition between consecutive bits. In this ideal scenario, sampling clock signal $T_0$ is used to sample the transition preceding data bit i, sampling clock signal $S_0$ is used to sample the center of data bit i, sampling clock signal $T_1$ is used to sample the transition preceding data bit i+1, and sampling clock signal $S_1$ (not shown in FIG. 3) is used to sample the center of data bit i+1. Sampling clock signal $T_0$ would again be used to sample the transition preceding data bit i+2, and so on.

Ideally, (1) the four sampling clock signals ($T_0$, $S_0$, $T_1$, $S_1$) are phase-aligned with the bit transitions and centers of bits in data signal 102 as represented in FIG. 3 and (2) the bulk delay over the four delay elements 202 in VCDL 112 is equal to the period of PLL clock signal 114, such that each consecutive pair of sampling clock signals ($T_0$, $S_0$, $T_1$, $S_1$) are separated by UI/2. In real-world implementations, however, these two conditions cannot be guaranteed. As such, receiver 100 is implemented with two control loops: (1) a first control loop to adjust the operations of VCDL 112 for phase differences between the sampling clock signals and the data signal and (2) a second control loop to adjust the operations of VCDL 112 for differences between the period of PLL clock signal 114 and the VCDL bulk delay.

Referring again to FIG. 1, for the first control loop, second-order proportional/integral (PI) filter 118 generates phase control signal 120, which is used by VCDL 112 to control the phases of the four sampling clock signals generated by VCDL 112 relative to the data signal.

For the second control loop, VCDL phase detector 122 compares two of the sampling clock signals (e.g., $S_0$ and $S_1$) and generates a digital control signal 124 representative of whether the delay between the two sampling clock signals is too small or too big relative to the period of PLL clock signal 114. For example, the delay may be less than a predetermined minimum threshold or greater than a predetermined maximum threshold wherein the minimum and maximum thresholds may be determined based on a performance metric for a given implementation. If the delay is too small, then phase detector 122 generates an up (UP) signal. If the delay is too big, then phase detector 122 generates a down (DN) signal. In one possible implementation, phase detector 122 always generates either an UP or a DN signal at each comparison. Digital UP/DN control signal 124 is filtered by digital filter 126 and then converted to the analog domain by current steering digital-to-analog converter (DAC) 128. The resulting current control signal 130 is applied to each delay element 202 in VCDL 112 to adjust (i.e., either increase or decrease) the input-to-output delay times of those elements.

First Control Loop

Referring again to FIG. 2, VCDL 112 has two mechanisms for adjusting the phases of sampling clock signals ($T_0$, $S_0$, $T_1$, $S_1$): a coarse mechanism and a fine mechanism, both of which are responsive to control signal 120 from PI filter 118. The coarse phase-adjustment mechanism is based on the ability to selectively inject clock signal 204 into any one of the four delay elements in VCDL 112. The fine phase-adjustment mechanism is based on the ability to selectively delay PLL clock signal 114 by any one of a number of different delay increments in order to generate clock signal 204.

In the embodiment of FIG. 2, the fine phase-adjustment mechanism is implemented using delay element 206 and interpolator 208. In one possible implementation, delay element 206 delays one version of PLL clock signal 114 by UI/2, where both delayed version 210 and undelayed version 212 are applied to interpolator 208, which is capable of selectively outputting any one of the following eight interpolated clock signals as clock signal 204:

Interpolated clock signal 0=PLL clock signal 114;
Interpolated clock signal 1=PLL clock signal 114 delayed by UI/16;
Interpolated clock signal 2=PLL clock signal 114 delayed by 2UI/16;
Interpolated clock signal 3=PLL clock signal 114 delayed by 3UI/16;
Interpolated clock signal 4=PLL clock signal 114 delayed by 4UI/16;
Interpolated clock signal 5=PLL clock signal 114 delayed by 5UI/16;
Interpolated clock signal 6=PLL clock signal 114 delayed by 6UI/16; and
Interpolated clock signal 7=PLL clock signal 114 delayed by 7UI/16.

In other implementations, other sets of interpolated clock signals may be available, and, in other embodiments, other types of circuitry may be employed to generate delayed clock signal 210.

The coarse phase-adjustment mechanism of VCDL 112 is represented in FIG. 2 by clock signal 204 being connected to each delay element 202. Within each delay element 202 is switch circuitry (not shown) that selectively enables clock signal 204 to be injected into one of the delay elements for initial delay and subsequent propagation through the rest of the delay elements. As such, each delay element 202 is capable of selecting either clock signal 204 or the output of the previous delay element as its input. The switch circuitry is controlled based on phase control signal 120 of FIG. 1.

For example, if clock signal 204 is selected to be injected into delay element 202-0, then delay element 202-0 delays clock signal 204 by UI/2 to generate sampling clock signal $T_0$, which is itself applied to delay element 202-1, which delays sampling clock signal $T_0$ by another UI/2 to generate sampling clock signal $S_0$, which is itself applied to delay element 202-2, which delays sampling clock signal $S_0$ by another UI/2 to generate sampling clock signal $T_1$, which is itself applied to delay element 202-3, which delays sampling clock signal $T_1$ by another UI/2 to generate sampling clock signal $S_1$. Note that, in this configuration, sampling clock signal $S_1$ is not selected as an input to delay element 202-0.

If, however, clock signal 204 is selected to be injected into delay element 202-1, then delay element 202-1 delays clock signal 204 by UI/2 to generate sampling clock signal $S_0$, which is itself applied to delay element 202-2, which delays sampling clock signal $S_0$ by another UI/2 to generate sampling clock signal $T_1$, which is itself applied to delay element 202-3, which delays sampling clock signal $T_1$ by another UI/2 to generate sampling clock signal $S_1$, which is itself applied to delay element 202-0, which delays sampling clock signal $S_1$ by another UI/2 to generate sampling clock signal $T_0$. Note that, in this configuration, sampling clock signal $T_0$ is not selected as an input to delay element 202-1. Analogous processing occurs if clock signal 204 is selected to be injected into delay element 202-2 or 202-3.

Figure 4:
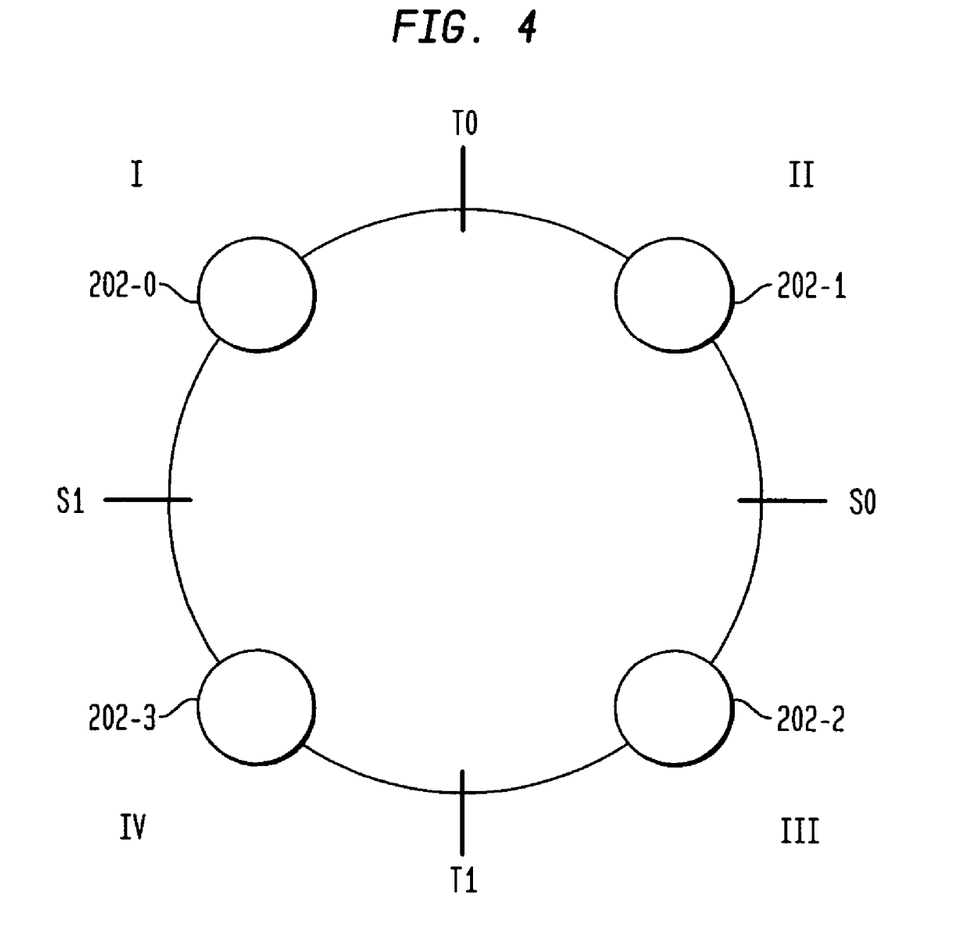
FIG. 4 shows a representation of the possible injection points within the VCDL of FIG. 2.

FIG. 4 shows a representation of the four possible injection points within VCDL 112 of FIG. 2, where injection into delay element 202-0 corresponds to Quadrant I, injection into delay element 202-1 corresponds to Quadrant II, injection into delay element 202-2 corresponds to Quadrant III, and injection into delay element 202-3 corresponds to Quadrant IV. In one implementation of VCDL 112, the coarse phase-adjustment mechanism is limited to changing the injection point by only one delay element. As such, if delay element 202-0 is the current injection point, then the coarse mechanism can change the next injection point to be either the immediately preceding delay element (i.e., delay element 202-3) or the immediately following delay element (i.e., delay element 202-1), but not delay element 202-2. And, similarly, when any of the other three delay elements is the current injection point.

In VCDL 112 of FIG. 2, both interpolator control and injection point control are switched at the same time in order for the sampling clock signals to bear as little jitter as possible. This is especially difficult to implement when the interpolator reaches its minimum (e.g., interpolated clock signal 0) or maximum (e.g., interpolated clock signal 7) of the interpolation range and has to be rolled over (e.g., from interpolated clock signal 0 to interpolated clock signal 7 or from interpolated clock signal 7 to interpolated clock signal 0) with a simultaneous change in the selected injection point.

If, for example, (1) delay element 202-0 is the current injection point, (2) interpolated clock signal 3 is currently selected to be clock signal 204, and (3) the phase of the sampling clock signals needs to be further delayed by UI/16 (delay increase), then interpolator 208 can be controlled to select interpolated clock signal 4 as the new clock signal 204 without having to change the injection point.

Similarly, if (1) delay element 202-0 is the current injection point, (2) interpolated clock signal 3 is currently selected to be clock signal 204, and (3) the phase of the sampling clock signals needs to be shifted earlier in time by UI/16 (delay decrease), then interpolator 208 can be controlled to select interpolated clock signal 2 as the new clock signal 204 without having to change the injection point.

However, if (1) delay element 202-0 is the current injection point, (2) interpolated clock signal 0 is currently selected to be clock signal 204, and (3) the phase of the sampling clock signals needs to be shifted earlier in time by UI/16, then (i) interpolator 208 should be controlled to select interpolated clock signal 7 as the new clock signal 204 and (ii) delay element 202-1 should be selected as the new injection point. All of these changes can start at the rising edge of undelayed clock signal 212 and should be finalized by the falling edge of delayed clock signal 210. Thus, the time allocated for interpolator change and settling is about 1.5UI.

Figure 5:
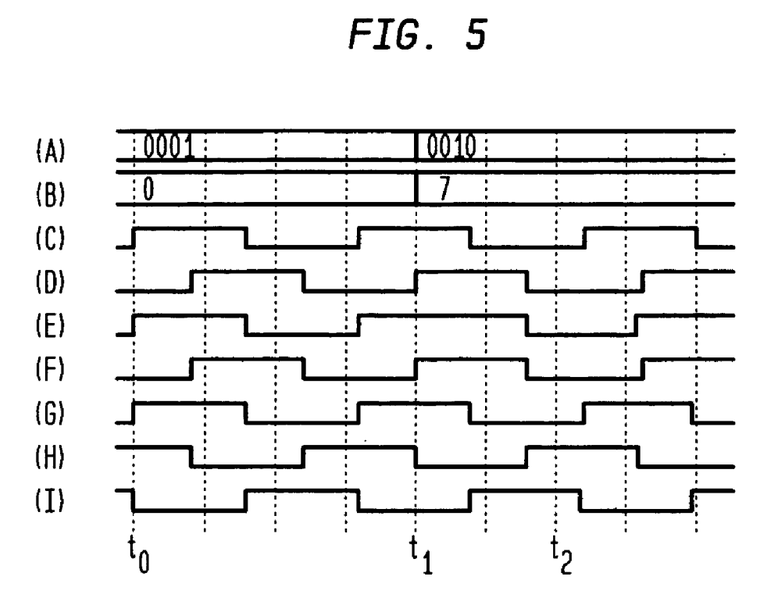
FIG. 5 shows a timing diagram of a scenario in which interpolated clock signal 0 is initially the injected clock signal and the phases of the sampling clock signals need to be shifted earlier in time by UI/16 (delay decrease)

FIG. 5 shows a timing diagram of this latter scenario. In FIG. 5:
(a) represents control bus #1, which indicates the selected injection point;
(b) represents control bus #2, which indicates the selected interpolated clock signal for clock signal 204. Both control buses are influenced by control signal 120 of FIG. 1, such that, when a delay increase or decrease is requested by control signal 120, the control buses #1 and #2 are incremented or decremented correspondingly;
(c) represents undelayed clock signal 212;
(d) represents delayed clock signal 210;
(e) represents clock signal 204;
(f) represents sampling clock signal $S_1$;
(g) represents sampling clock signal $T_1$;
(h) represents sampling clock signal $S_0$; and
(i) represents sampling clock signal $T_0$.

As represented in FIG. 5, at the beginning of this scenario (time $t_0$), control bus #1 has a value of (0001) indicating that delay element 202-0 is the current injection point, and control bus #2 has a value of 0 indicating that interpolated clock signal 0 is currently selected for clock signal 204. At time $t_1$, the value of control bus #1 changes to (0010) indicating that delay element 202-1 is the new injection point, and the value of control bus #2 changes to 7 indicating that interpolated clock signal 7 is now selected for clock signal 204. As shown in FIG. 5(e), following the changes in the selected injection point and the selected interpolated clock signal at time $t_1$, the next transition in clock signal 204 does not occur until time $t_2$, which is about 1.5 UI after time $t_1$.

On the other hand, if (1) delay element 202-0 is the current injection point, (2) interpolated clock signal 7 is currently selected to be clock signal 204, and (3) the phase of the sampling clock signals needs to be further delayed by UI/16, then (i) interpolator 208 should be controlled to select interpolated clock signal 0 as the new clock signal 204 and (ii) delay element 202-3 should be selected as the new injection point. All of these changes can start at the rising edge of delayed clock signal 210 and should be finalized by the falling edge of undelayed clock signal 212. Thus, the time allocated for interpolator change and settling is only about 0.5 UI.

Figure 6:
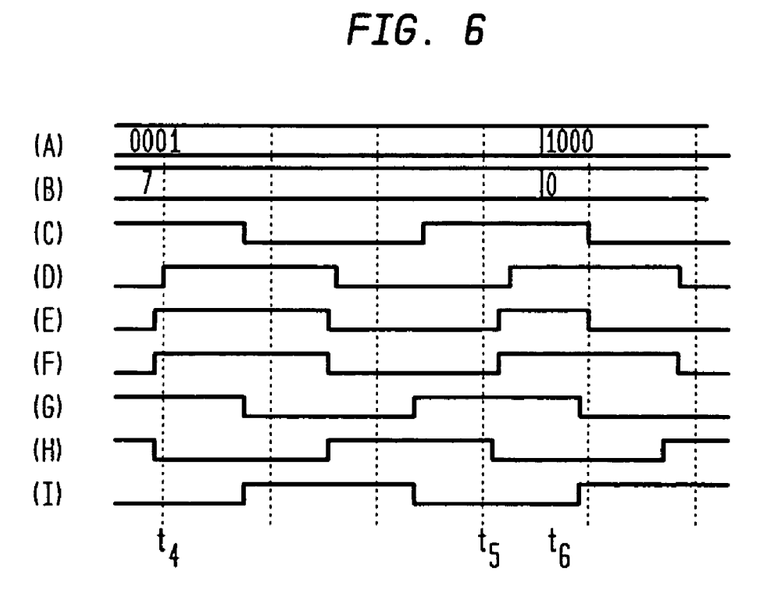
FIG. 6 shows a timing diagram of a scenario in which interpolated clock signal 7 is initially the injected clock signal and the phases of the sampling clock signals need to be further delayed by UI/16 (delay increase)

FIG. 6 shows a timing diagram of this scenario, where FIG. 6 is analogous to FIG. 5. As represented in FIG. 6, at the beginning of this scenario (time $t_4$), control bus #1 has a value of (0001) indicating that delay element 202-0 is the current injection point, and control bus #2 has a value of 7 indicating that interpolated clock signal 7 is currently selected for clock signal 204. At time $t_5$, the value of control bus #1 changes to (1000) indicating that delay element 202-3 is the new injection point, and the value of control bus #2 changes to 0 indicating that interpolated clock signal 0 is now selected for clock signal 204. As shown in FIG. 6(e), following the changes in the selected injection point and the selected interpolated clock signal at time $t_5$, the next transition in clock signal 204 occurs at time $t_6$, which is only about 0.5 UI after time $t_5$.

Depending on the data rate of data signal 102, which determines the size of UI, it may be difficult, expensive, or even impossible to implement circuitry for interpolator 208 and the switch circuitry within each delay element 202 that can meet the timing requirements of FIG. 5 and especially FIG. 6 without producing unacceptable levels of sampling clock jitter. For example, for a data rate of 6 Gbps, 0.5 UI is about 80 picoseconds (ps). Moreover, the output pulse from interpolator 208 can be relatively short (i.e., about 0.5 UI), which can be difficult to propagate to the injection point with sufficient precision.

Figure 7:
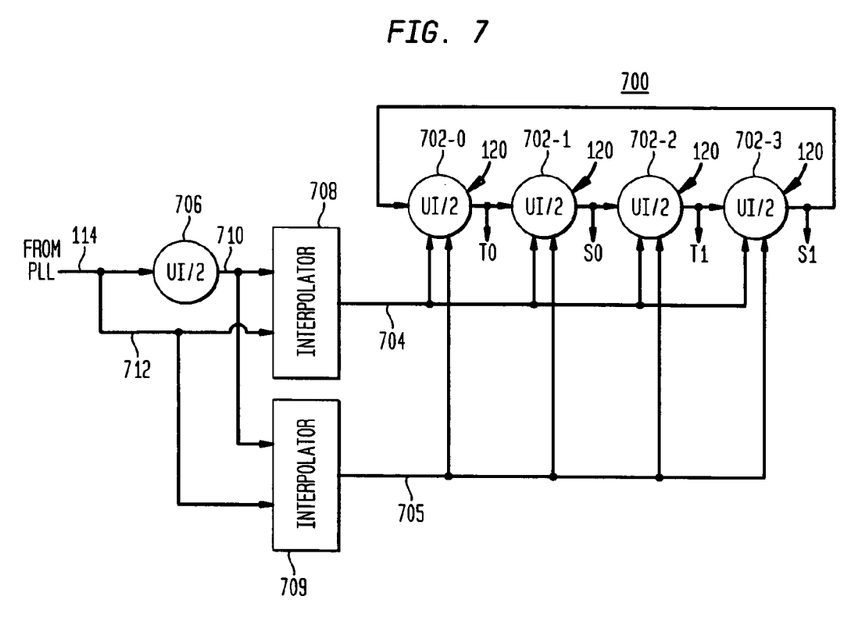
FIG. 7 shows a block diagram of a voltage-controlled delay loop that can be used in place of the VCDL of FIG. 2 in the receiver of FIG. 1, according to one embodiment of the present invention.

FIG. 7 shows a block diagram of voltage-controlled delay loop 700, which can be used in place of VCDL 112 in receiver 100 of FIG. 1, according to one embodiment of the present invention. VCDL 700 is analogous to VCDL 112 with analogously labeled elements (i.e., same last two digits) with one exception being that VCDL 700 has a second, independently controllable interpolator 709, which operates in parallel with interpolator 708, to generate clock signal 705. As shown in FIG. 7, both clock signals 704 and 705 are connected to each delay element 702, each of which has switch circuitry (not shown) controllable to select one of clock signals 704 and 705 to be injected into one of the delay elements.

According to one implementation, VCDL 700 employs a "leap-frog" technique in which one interpolator is being prepared for use while the other is currently in use. Thus, while one (i.e., on-line) interpolator is used to generate the interpolated clock signal that is currently injected into one of the delay elements, the other (i.e., off-line) interpolator can be controlled to start to generate a different interpolated clock signal for subsequent injection. In particular, when a request is received from the VCDL controller (not shown) to change the interpolated clock signal selection, the change can be immediately applied to the off-line interpolator, where the off-line interpolator will be the source of the next selected interpolated clock signal. As such, the off-line interpolator will have more time to settle than is the case with VCDL 112 of FIG. 1. In certain applications, requests for changing the phases of the sampling clock signals are allowed to occur once every 4 UI. In such applications, the off-line interpolator may have as long as 3 UI to settle before the next interpolated clock signal is needed. For a 6-Gbps data rate, this is about 480 ps, for which circuitry is much easier to realize than for the 80-ps timing of VCDL 112.

Returning to the scenario of FIG. 6, if, at time $t_4$, interpolator 708 is the source of interpolated clock signal 7 and clock signal 704 is injected into delay element 702-0, then, when the request to switch to interpolated clock signal 0 and delay element 702-3 is received, off-line interpolator 709 can be immediately controlled to start to generate interpolated clock signal 7. In that case, delay element 702-3 will eventually be instructed to select clock signal 705, and delay element 702-0 will be instructed to deselect clock signal 704. In this scenario, interpolator 709 has more time (e.g., up to 3 UI) to settle to interpolated clock signal 7.

Figure 8:
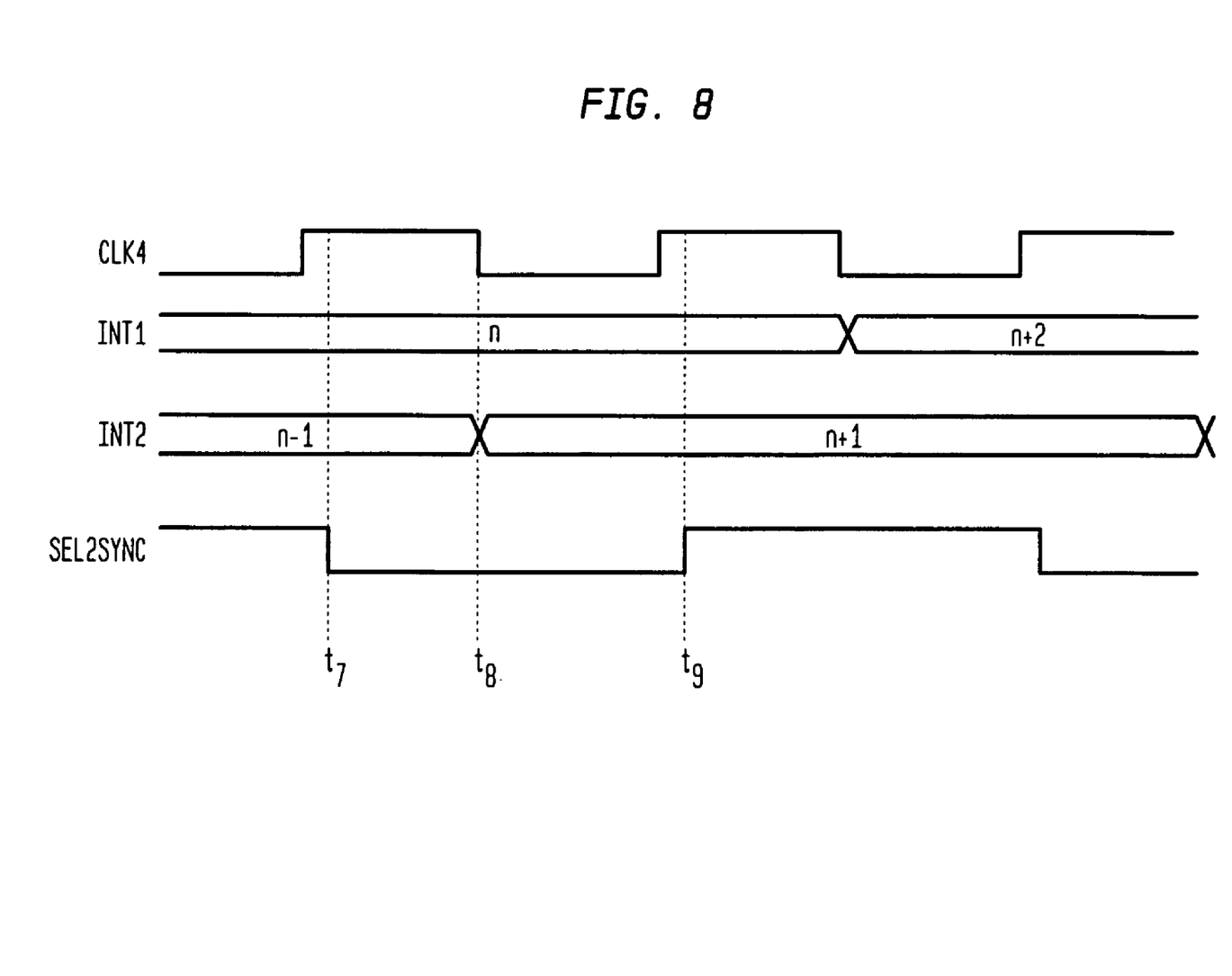
FIG. 8 shows a timing diagram of a scenario of the present invention.

FIG. 8 shows a timing diagram for one possible implementation of VCDL 700 of FIG. 7. In FIG. 8, clock signal CLK4, which has a 4-UI period, controls the generation of phase-adjustment requests, where at most one request for adjustment is generated every 4 UI. According to the leap-frog technique, in this scenario, all even requests (e.g., n, n+2) are handled by interpolator 708, while all odd requests (e.g., n−1, n+1) are handled by interpolator 709, as indicated by control buses INT1 and INT2, respectively. At time $t_7$, SEL2SYNC goes low, indicating that interpolator 708 is to be the source of the currently selected interpolated clock signal n. At time $t_8$, interpolator 709 starts to generate the next interpolated clock signal n+1. At time $t_9$, SEL2SYNC goes high, indicating that interpolator 709 is to be the source of the currently selected interpolated clock signal n+1. Here, interpolator 709 has about 2 UI to settle to the new interpolated clock signal n+1 before it is switched on-line. Following the switch at time $t_9$, interpolator 708 is free to start to generate the next interpolated clock signal n+2.

Although the present invention has been described in the context of a VCDL having two interpolators, the present invention can also be implemented with more than two interpolators, where two or more off-line interpolators can be used to settle to different interpolated clock signals for sequential, subsequent on-line use. In this way, even faster data rates and/or faster clock-adjustment rates can be supported.

In certain implementations, there may be a limit on the magnitude of the incremental change in interpolated clock signals. For example, in one possible implementation, the selection of the interpolated clock signal may be increased or decreased by at most two interpolated clock increments. Thus, if interpolated clock signal 4 is currently selected, then the next interpolated clock signal selected would be limited to any of interpolated clock signals 2, 3, 4, 5, or 6. Similarly, if interpolated clock signal 6 is currently selected, then the next interpolated clock signal selected would be limited to any of interpolated clock signals 4, 5, 6, 7, or 0, where interpolated clock signal 0 corresponds to an increase by two interpolated clock increments.

Although the present invention has been described in the context of a VCDL having four delay elements, the present invention can also be implemented in the context of VCDLs having fewer or more delay elements.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:

1. Circuitry comprising a delay loop having:
   a first device adapted to generate a first clock signal based on an input clock signal;
   a second device adapted to generate a second clock signal based on the input clock signal; and
   a plurality of sequentially arranged delay elements, each delay element connected to receive the first and second clock signals and adapted to generate a corresponding output clock signal, wherein:
      the delay loop is adapted to control (1) the generation of the first and second clock signals by the first and second devices and (2) selection of one of the first and second clock signals for injection into one of the delay elements, such that, when a currently selected clock signal is generated by an on-line one of the first and second devices, the other device is off-line; and
      the delay loop is adapted to use the off-line device to generate a next clock signal to be injected into one of the delay elements.

2. The invention of claim 1, wherein:
   the circuitry comprises a receiver comprising the delay loop;
   the output clock signals from the delay elements are used to sample a data signal received by the receiver; and
   the delay loop is adapted to control the generation and selection of the first and second clock signals and the selection of an injection point for the selected clock signal in order to synchronize the output clock signals with data in the data signal.

3. The invention of claim 2, further comprising another delay element adapted to generate a delayed version of the input clock signal, wherein:
   each device is an interpolator adapted to (i) receive the delayed version and an undelayed version of the input clock signal and (ii) generate its clock signal by interpolating between the delayed and undelayed versions of the input clock signal.

4. The invention of claim 1, further comprising another delay element adapted to generate a delayed version of the input clock signal, wherein:
   each device is an interpolator adapted to (i) receive the delayed version and an undelayed version of the input clock signal and (ii) generate its clock signal by interpolating between the delayed and undelayed versions of the input clock signal.

5. A method for operating a delay loop comprising a plurality of sequentially arranged delay elements, each adapted to generate a corresponding output clock signal, the method comprising:
   generating a first clock signal based on an input clock signal;
   generating a second clock signal based on the input clock signal; and
   controlling (1) the generation of the first and second clock signals and (2) selection of one of the first and second clock signals for injection into one of the delay elements, such that, when the first clock signal is selected for injection into one of the delay elements, the second clock signal is generated off-line for subsequent injection into one of the delay elements.

6. The invention of claim 5, wherein:
   the delay loop is part of a receiver; and
   the method further comprises:
      using the output clock signals from the delay elements to sample a data signal received by the receiver; and
      using the delay loop to control the generation and selection of the first and second clock signals and the selection of an injection point for the selected clock signal in order to synchronize the output clock signals with data in the data signal.

7. The invention of claim 6, further comprising:
   generating a delayed version of the input clock signal;
   receiving the delayed version and an undelayed version of the input clock signal; and
   generating at least one of the first and second clock signals by interpolating between the delayed and undelayed versions of the input clock signal.

8. The invention of claim 5, further comprising:
   generating a delayed version of the input clock signal;
   receiving the delayed version and an undelayed version of the input clock signal; and
   generating at least one of the first and second clock signals by interpolating between the delayed and undelayed versions of the input clock signal.

* * * * *